United States Patent
Liu et al.

(10) Patent No.: US 10,153,335 B1
(45) Date of Patent: Dec. 11, 2018

(54) MANUFACTURING METHOD OF TRANSISTOR ON COLOR FILTER TYPE ORGANIC LIGHT EMITTING DISPLAY AND TRANSISTOR ON COLOR FILTER TYPE ORGANIC LIGHT EMITTING DISPLAY

(71) Applicant: Shenzhen China Star Optoelectronics Semiconductor Display Technology Co., Ltd., Shenzhen (CN)

(72) Inventors: Fangmei Liu, Shenzhen (CN); Xingyu Zhou, Shenzhen (CN)

(73) Assignee: SHENZHEN CHINA STAR OPTELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/570,376

(22) PCT Filed: Jul. 13, 2017

(86) PCT No.: PCT/CN2017/092874
§ 371 (c)(1),
(2) Date: Oct. 30, 2017

(30) Foreign Application Priority Data

May 25, 2017 (CN) .......................... 2017 1 0389002

(51) Int. Cl.
*H01L 27/32* (2006.01)
*H01L 51/52* (2006.01)
*H01L 51/56* (2006.01)
*H01L 27/12* (2006.01)
(Continued)

(52) U.S. Cl.
CPC ........ *H01L 27/3262* (2013.01); *H01L 27/322* (2013.01); *H01L 27/3272* (2013.01); *H01L 51/5284* (2013.01); *H01L 51/56* (2013.01);
*H01L 27/127* (2013.01); *H01L 27/1225* (2013.01); *H01L 27/1292* (2013.01); *H01L 29/4908* (2013.01); *H01L 29/7869* (2013.01);
(Continued)

(58) Field of Classification Search
CPC ............ H01L 27/3262; H01L 51/5284; H01L 27/3272; H01L 27/322; H01L 29/78633
USPC ........................................................ 438/23
See application file for complete search history.

(56) References Cited

U.S. PATENT DOCUMENTS

2003/0117573 A1    6/2003   Yi et al.

FOREIGN PATENT DOCUMENTS

| CN | 102938411 A | 2/2013 |
| CN | 103107288 A | 5/2013 |
| CN | 105655346 A | 6/2016 |

(Continued)

*Primary Examiner* — Anthony Ho
(74) *Attorney, Agent, or Firm* — Leong C. Lei

(57) ABSTRACT

Provided are a manufacturing method of a transistor on color filter type organic light emitting display and a transistor on color filter type organic light emitting display. In the manufacturing method of a transistor on color filter type organic light emitting display, after preparing the color filter layer, by coating the zinc oxide solution mixed with lithium on the gate insulation layer in a spin coating manner to form a zinc oxide coating layer mixed with lithium and then, by annealing the zinc oxide coating layer mixed with lithium and patterning the zinc oxide coating layer mixed with lithium to form a channel layer, the process temperature can be as low as 200 Celsius degrees to satisfy the temperature condition of manufacturing the transistor on color filter type organic light emitting display and the operation is easy without using the expensive vacuum equipment.

11 Claims, 2 Drawing Sheets

(51) Int. Cl.
   *H01L 29/49* (2006.01)
   *H01L 29/786* (2006.01)
(52) U.S. Cl.
   CPC .. *H01L 29/78633* (2013.01); *H01L 2227/323* (2013.01)

(56) References Cited

FOREIGN PATENT DOCUMENTS

| | | |
|---|---|---|
| CN | 205900543 U | 1/2017 |
| CN | 106409871 A | 2/2017 |
| KR | 20020007899 A | 1/2002 |

MANUFACTURING METHOD OF TRANSISTOR ON COLOR FILTER TYPE ORGANIC LIGHT EMITTING DISPLAY AND TRANSISTOR ON COLOR FILTER TYPE ORGANIC LIGHT EMITTING DISPLAY

FIELD OF THE INVENTION

The present invention relates to an organic light emitting display process field, more particularly to a manufacturing method of a transistor on color filter type organic light emitting display and a transistor on color filter type organic light emitting display.

BACKGROUND OF THE INVENTION

In the display field, Liquid Crystal Display (LCD), Organic Light Emitting Diode (OLED) and other panel display devices have been gradually replaced the Cathode Ray Tube (CRT) displays.

The OLED display possesses many outstanding properties of self-illumination, low driving voltage, high luminescence efficiency, fast response, high clarity and contrast, near 180° view angle, wide range of working temperature, applicability of flexible display and large scale full color display. The OLED is considered as the most potential flat panel display technology.

With the development of the display technology, there has been a TOC (Transistor On Color Filter) type OLED display, in which a thin-film transistor (TFT) driving circuit is provided on a color filter (CF). The polarizer can be eliminated in the TOC type OLED display, which can make the OLED display element thinner and the manufacture cost is lower.

The manufacturing process of the TOC type OLED display comprises:

first, preparing CF on the substrate;
then, preparing TFTs on the color filter layer.

Since the color filters (CF) is prepared first, the following preparation of TFT must be conducted in a condition that a temperature is less than 230 Celsius degrees.

Besides, the conventional TOC type OLED display generally uses a material, such as indium (In), gallium (Ga) and other expensive rare metal materials to fabricate a channel layer of a TFT. Although the electrical performance of the TFT can be improved, the production cost needs to be further reduced.

SUMMARY OF THE INVENTION

An objective of the present invention is to provide a manufacturing method of a transistor on color filter type organic light emitting display, which can prepare the TFT in a condition that a temperature is less than 230 Celsius degrees and effectively reduce a material cost of a channel layer and a TFT equipment cost to be economic and environmentally protective.

Another objective of the present invention is to provide a transistor on color filter type organic light emitting display, in which the TFT electrical performance is better and the production cost is lower.

For realizing the aforesaid objectives, the present invention first provides a manufacturing method of a transistor on color filter type organic light emitting display, comprising steps of:

Step S1, providing a substrate, and performing clean and pre-cure to the substrate;

Step S2, depositing a black light shielding thin film and patterning the black light shielding thin film to form a black matrix;

Step S3, sequentially depositing color filters of various colors in the black matrix to form a color filter layer;

Step S4, depositing a planarization layer on the color filter layer;

Step S5, depositing a first metal layer on the planarization layer and patterning the first metal layer to form a gate;

Step S6, depositing a gate insulation layer covering the gate and the planarization layer;

Step S7, preparing a zinc oxide solution mixed with lithium and coating the zinc oxide solution mixed with lithium on the gate insulation layer by spin coating to form a zinc oxide coating layer mixed with lithium, then annealing the zinc oxide coating layer mixed with lithium and patterning the zinc oxide coating layer mixed with lithium to form a channel layer;

Step S8, depositing an etching stopper layer and patterning the etching stopper layer to form a first through hole and a second through hole which respectively expose two sides of the channel layer;

Step S9, depositing a second metal layer on the etching stopper layer and patterning the second metal layer to form a source and a drain; wherein the source and the drain respectively contact the two sides of the channel layer via the first through hole and the second through hole;

Step S10, sequentially preparing a protective layer, an anode, a pixel definition layer, an organic light emitting diode layer and a cathode on the etching stopper layer, the source and the drain.

In Step S1, the substrate is a glass substrate.

In Step S3, the color filters of various colors comprise red color filters, green color filters and blue color filters.

A material of the planarization layer, the gate insulation layer, the etching stopper layer and the protective layer is silicon oxide, silicon nitride or a combination of the two.

A material of the first metal layer and the second metal layer is a stack combination of one or more of molybdenum, titanium, aluminum and copper.

In Step S7, lithium hydroxide and zinc hydroxide as raw materials for preparing the zinc oxide solution mixed with lithium.

A material of the anode is indium tin oxide.

The present invention further provides a transistor on color filter type organic light emitting display prepared by the foregoing manufacturing method of the transistor on color filter type organic light emitting display, wherein a material of the channel layer is zinc oxide mixed with lithium.

The present invention further provides a manufacturing method of a transistor on color filter type organic light emitting display, comprising steps of:

Step S1, providing a substrate, and performing clean and pre-cure to the substrate;

Step S2, depositing a black light shielding thin film and patterning the black light shielding thin film to form a black matrix;

Step S3, sequentially depositing color filters of various colors in the black matrix to form a color filter layer;

Step S4, depositing a planarization layer on the color filter layer;

Step S5, depositing a first metal layer on the planarization layer and patterning the first metal layer to form a gate;

Step S6, depositing a gate insulation layer covering the gate and the planarization layer;

Step S7, preparing a zinc oxide solution mixed with lithium and coating the zinc oxide solution mixed with lithium on the gate insulation layer by spin coating to form a zinc oxide coating layer mixed with lithium, then annealing the zinc oxide coating layer mixed with lithium and patterning the zinc oxide coating layer mixed with lithium to form a channel layer;

Step S8, depositing an etching stopper layer and patterning the etching stopper layer to form a first through hole and a second through hole which respectively expose two sides of the channel layer;

Step S9, depositing a second metal layer on the etching stopper layer and patterning the second metal layer to form a source and a drain; wherein the source and the drain respectively contact the two sides of the channel layer via the first through hole and the second through hole;

Step S10, sequentially preparing a protective layer, an anode, a pixel definition layer, an organic light emitting diode layer and a cathode on the etching stopper layer, the source and the drain;

wherein in Step S1, the substrate is a glass substrate;

wherein a material of the planarization layer, the gate insulation layer, the etching stopper layer and the protective layer is silicon oxide, silicon nitride or a combination of the two;

wherein a material of the first metal layer and the second metal layer is a stack combination of one or more of molybdenum, titanium, aluminum and copper;

wherein in Step S7, lithium hydroxide and zinc hydroxide as raw materials for preparing the zinc oxide solution mixed with lithium.

The benefits of the present invention are: the present invention provides a manufacturing method of a transistor on color filter type organic light emitting display. After preparing the color filter layer, by coating the zinc oxide solution mixed with lithium on the gate insulation layer in a spin coating manner to form a zinc oxide coating layer mixed with lithium and then, by annealing the zinc oxide coating layer mixed with lithium and patterning the zinc oxide coating layer mixed with lithium to form a channel layer, the process temperature can be as low as 200 Celsius degrees to satisfy the temperature condition of manufacturing the transistor on color filter type organic light emitting display and the operation is easy without using the expensive vacuum equipment. Meanwhile, lithium instead of indium, gallium and other expensive rare metals is mixed in the channel layer, which cannot only improve the electrical performance of TFT but the material cost is also low, more economical and environmentally friendly. In the transistor on color filter type organic light emitting display provided by the present invention, the material of the channel layer therein is zinc oxide mixed with lithium so that the TFT electrical performance is better and the production cost is lower.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
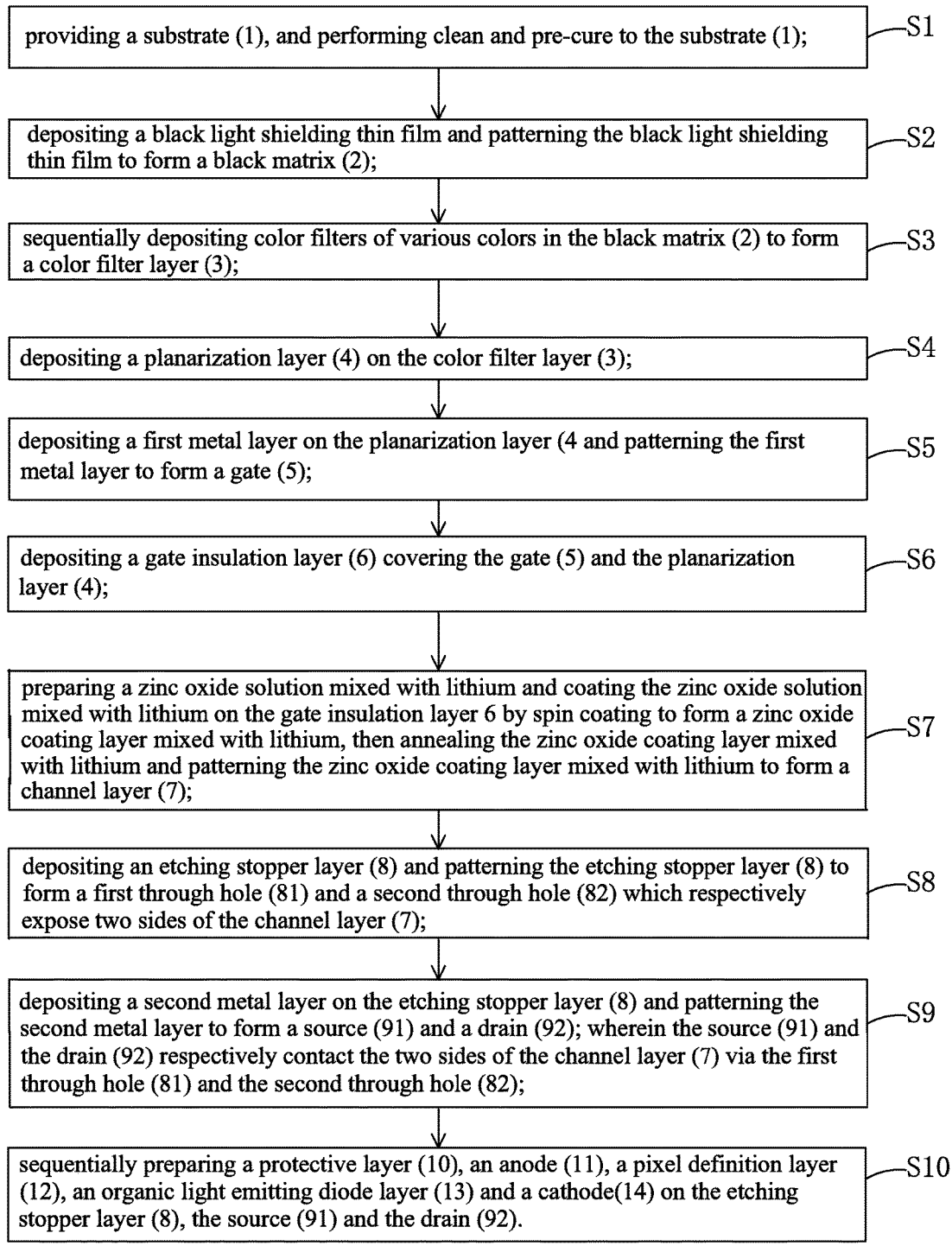
FIG. 1 is a flowchart of a manufacturing method of a transistor on color filter type organic light emitting display according to the present invention.
Figure 2:
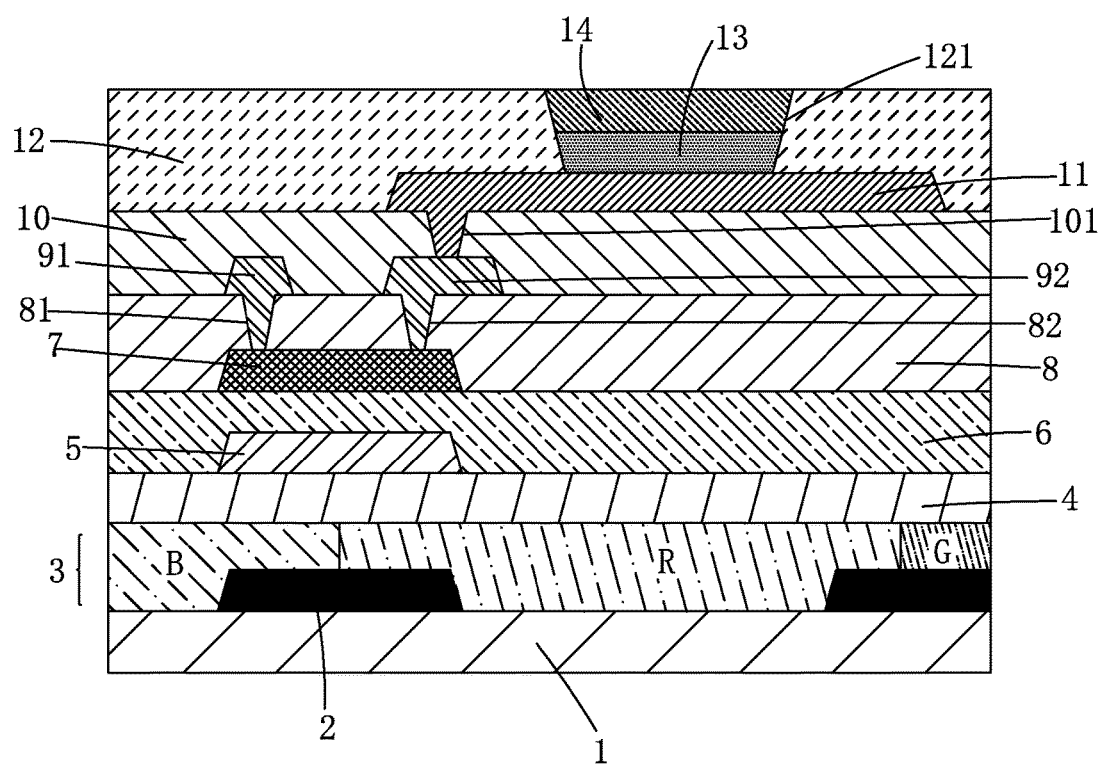
FIG. 2 is a sectional structure diagram of a transistor on color filter type organic light emitting display according to the present invention.

Please refer to FIG. 1 with FIG. 2. The present invention first provides a manufacturing method of a transistor on color filter type organic light emitting display, comprising steps of:

Step S1, providing a substrate 1, and performing clean and pre-cure to the substrate 1.

Specifically, the substrate 1 is preferably a glass substrate.

Step S2, depositing a black light shielding thin film and patterning the black light shielding thin film with a mask to form a black matrix 2.

Step S3, sequentially depositing color filters of various colors in the black matrix 2 to form a color filter layer 3.

Specifically, the color filters of various colors at least comprise red color filters R, green color filters G and blue color filters B.

Step S4, depositing a planarization layer 4 on the color filter layer 3.

Specifically, a material of the planarization layer 4 is silicon oxide (SiOx), silicon nitride (SiNx) or a combination of the two.

Step S5, depositing a first metal layer on the planarization layer 4 and patterning the first metal layer with a mask to form a gate 5.

Specifically, a material of the first metal layer is a stack combination of one or more of molybdenum (Mo), titanium (Ti), aluminum (Al) and copper (Cu).

Step S6, depositing a gate insulation layer 6 covering the gate 5 and the planarization layer 4.

Specifically, a material of the gate insulation layer 6 is silicon oxide, silicon nitride or a combination of the two.

Step S7, preparing a zinc oxide (ZnO) solution mixed with lithium (Li) and coating the zinc oxide solution mixed with lithium (Li—ZnO) on the gate insulation layer 6 by spin coating to form a zinc oxide (ZnO) coating layer mixed with lithium (Li), then annealing the zinc oxide coating layer mixed with lithium and patterning the zinc oxide coating layer mixed with lithium to form a channel layer 7.

Specifically, in Step S7, lithium hydroxide (LiOH) and zinc hydroxide (Zn(OH)2) as raw materials for preparing the zinc oxide solution mixed with lithium.

Step S8, depositing an etching stopper layer 8 and patterning the etching stopper layer 8 with a mask to form a first through hole 81 and a second through hole 82 which respectively expose two sides of the channel layer 7.

Specifically, a material of the etching stopper layer 8 is silicon oxide, silicon nitride or a combination of the two.

Step S9, depositing a second metal layer on the etching stopper layer 8 and patterning the second metal layer with a mask to form a source 91 and a drain 92.

Specifically, a material of the second metal layer also is a stack combination of one or more of Mo, Ti, Al and Cu.

The source 91 and the drain 92 respectively contact the two sides of the channel layer 7 via the first through hole 81 and the second through hole 82.

The gate 5, the gate insulation layer 6, the channel layer 7, the source 91 and the drain 92 construct a TFT (thin film transistor).

Step S10, sequentially preparing a protective layer 10, an anode 11, a pixel definition layer 12, an organic light emitting diode layer 13 and a cathode 14 on the etching stopper layer 8, the source 91 and the drain 92.

Specifically, a material of the protective layer 10 is SiOx, SiNx or a combination of the two.

A material of the anode 11 is Indium Tin Oxide (ITO).

A material of the pixel definition layer 12 is organic photoresist.

The protective layer 10 is patterned to possess a third through hole 101 exposing a partial surface of the drain 92. The pixel definition layer 12 is patterned to possess a fourth through hole 121 exposing a partial surface of the anode 11. The anode 11 contacts the drain 92 via the third through hole 101. The OLED layer 13 and the cathode 14 are inside the fourth through hole 121 in order.

In the aforesaid manufacturing method of the transistor on color filter type organic light emitting display according to the present invention, after preparing the color filter layer 3, by coating the zinc oxide solution mixed with lithium on the gate insulation layer in a spin coating manner to form a zinc oxide coating layer mixed with lithium and then, by annealing the zinc oxide coating layer mixed with lithium and patterning the zinc oxide coating layer mixed with lithium to form a channel layer 7, the process temperature can be as low as 200 Celsius degrees to satisfy the temperature condition of manufacturing the transistor on color filter type organic light emitting display and the operation is easy without using the expensive vacuum equipment. Meanwhile, lithium instead of indium, gallium and other expensive rare metals is mixed in the channel layer 7, which cannot only improve the electrical performance of TFT but the material cost is also low, more economical and environmentally friendly.

On the basis of the same inventive idea, the present invention further provides a transistor on color filter type organic light emitting display manufactured by the foregoing manufacturing method of the transistor on color filter type organic light emitting display. As shown in FIG. 2, the TOC type OLED display comprises a substrate 1, a black matrix 2 arranged on the substrate 1, a color filter layer 3 filled in the black matrix 2, a planarization layer 4 covering the color filter layer 3, a gate 5 arranged on the planarization layer 4, a gate insulation layer 6 covering the gate 5 and the planarization layer 4, a channel layer 7 located above the gate 5 and arranged on the gate insulation layer 6, an etching stopper layer 8 covering the channel layer 7 and the gate insulation layer 6, a source 91 and a drain 92 arranged on the etching stopper layer 8, a protective layer 10 covering the source 91, the drain 92 and etching stopper layer 8, an anode 11 arranged on the protective layer 10, a pixel definition layer 12 arranged on the anode 11 and an organic light emitting layer 13 and a cathode 14 which are located in the pixel definition layer 12 and sequentially stacked on the anode 11.

The etching stopper layer 8 comprises a first through hole 81 and a second through hole 82 which respectively expose two sides of the channel layer 7. The protective layer 10 possesses a third through hole 101 exposing a partial surface of the drain 92. The pixel definition layer 12 possesses a fourth through hole 121 exposing a partial surface of the anode 11. The source 91 and the drain 92 respectively contact the two sides of the channel layer 7 via the first through hole 81 and the second through hole 82. The anode 11 contacts the drain 92 via the third through hole 101. The OLED layer 13 and the cathode 14 are inside the fourth through hole 121 in order.

A material of the channel layer 7 is zinc oxide mixed with lithium so that the TFT electrical performance is better and the production cost is lower.

In conclusion, in the manufacturing method of a transistor on color filter type organic light emitting display according to the present invention, after preparing the color filter layer, by coating the zinc oxide solution mixed with lithium on the gate insulation layer in a spin coating manner to form a zinc oxide coating layer mixed with lithium and then, by annealing the zinc oxide coating layer mixed with lithium and patterning the zinc oxide coating layer mixed with lithium to form a channel layer, the process temperature can be as low as 200 Celsius degrees to satisfy the temperature condition of manufacturing the transistor on color filter type organic light emitting display and the operation is easy without using the expensive vacuum equipment. Meanwhile, lithium instead of indium, gallium and other expensive rare metals is mixed in the channel layer, which cannot only improve the electrical performance of TFT but the material cost is also low, more economical and environmentally friendly. In the transistor on color filter type organic light emitting display of the present invention, the material of the channel layer therein is zinc oxide mixed with lithium so that the TFT electrical performance is better and the production cost is lower.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a transistor on color filter type organic light emitting display, comprising steps of:
    Step S1, providing a substrate, and performing clean and pre-cure to the substrate;
    Step S2, depositing a black light shielding thin film and patterning the black light shielding thin film to form a black matrix;
    Step S3, sequentially depositing color filters of various colors in the black matrix to form a color filter layer;
    Step S4, depositing a planarization layer on the color filter layer;
    Step S5, depositing a first metal layer on the planarization layer and patterning the first metal layer to form a gate;
    Step S6, depositing a gate insulation layer covering the gate and the planarization layer;
    Step S7, preparing a zinc oxide solution mixed with lithium and coating the zinc oxide solution mixed with lithium on the gate insulation layer by spin coating to form a zinc oxide coating layer mixed with lithium, then annealing the zinc oxide coating layer mixed with lithium and patterning the zinc oxide coating layer mixed with lithium to form a channel layer;
    Step S8, depositing an etching stopper layer and patterning the etching stopper layer to form a first through hole and a second through hole which respectively expose two sides of the channel layer;
    Step S9, depositing a second metal layer on the etching stopper layer and patterning the second metal layer to form a source and a drain; wherein the source and the drain respectively contact the two sides of the channel layer via the first through hole and the second through hole;

Step S10, sequentially preparing a protective layer, an anode, a pixel definition layer, an organic light emitting diode layer and a cathode on the etching stopper layer, the source and the drain.

2. The manufacturing method of the transistor on color filter type organic light emitting display according to claim 1, wherein in Step S1, the substrate is a glass substrate.

3. The manufacturing method of the transistor on color filter type organic light emitting display according to claim 1, wherein in Step S3, the color filters of various colors comprise red color filters, green color filters and blue color filters.

4. The manufacturing method of the transistor on color filter type organic light emitting display according to claim 1, wherein a material of the planarization layer, the gate insulation layer, the etching stopper layer and the protective layer is silicon oxide, silicon nitride or a combination of the two.

5. The manufacturing method of the transistor on color filter type organic light emitting display according to claim 1, wherein a material of the first metal layer and the second metal layer is a stack combination of one or more of molybdenum, titanium, aluminum and copper.

6. The manufacturing method of the transistor on color filter type organic light emitting display according to claim 1, wherein in Step S7, lithium hydroxide and zinc hydroxide as raw materials for preparing the zinc oxide solution mixed with lithium.

7. The manufacturing method of the transistor on color filter type organic light emitting display according to claim 1, wherein a material of the anode is indium tin oxide.

8. A transistor on color filter type organic light emitting display prepared by the manufacturing method of the transistor on color filter type organic light emitting display according to claim 1, wherein a material of the channel layer is zinc oxide mixed with lithium.

9. A manufacturing method of a transistor on color filter type organic light emitting display, comprising steps of:
Step S1, providing a substrate, and performing clean and pre-cure to the substrate;
Step S2, depositing a black light shielding thin film and patterning the black light shielding thin film to form a black matrix;
Step S3, sequentially depositing color filters of various colors in the black matrix to form a color filter layer;
Step S4, depositing a planarization layer on the color filter layer;
Step S5, depositing a first metal layer on the planarization layer and patterning the first metal layer to form a gate;
Step S6, depositing a gate insulation layer covering the gate and the planarization layer;
Step S7, preparing a zinc oxide solution mixed with lithium and coating the zinc oxide solution mixed with lithium on the gate insulation layer by spin coating to form a zinc oxide coating layer mixed with lithium, then annealing the zinc oxide coating layer mixed with lithium and patterning the zinc oxide coating layer mixed with lithium to form a channel layer;
Step S8, depositing an etching stopper layer and patterning the etching stopper layer to form a first through hole and a second through hole which respectively expose two sides of the channel layer;
Step S9, depositing a second metal layer on the etching stopper layer and patterning the second metal layer to form a source and a drain; wherein the source and the drain respectively contact the two sides of the channel layer via the first through hole and the second through hole;
Step S10, sequentially preparing a protective layer, an anode, a pixel definition layer, an organic light emitting diode layer and a cathode on the etching stopper layer, the source and the drain;
wherein in Step S1, the substrate is a glass substrate;
wherein a material of the planarization layer, the gate insulation layer, the etching stopper layer and the protective layer is silicon oxide, silicon nitride or a combination of the two;
wherein a material of the first metal layer and the second metal layer is a stack combination of one or more of molybdenum, titanium, aluminum and copper;
wherein in Step S7, lithium hydroxide and zinc hydroxide as raw materials for preparing the zinc oxide solution mixed with lithium.

10. The manufacturing method of the transistor on color filter type organic light emitting display according to claim 9, wherein in Step S3, the color filters of various colors comprise red color filters, green color filters and blue color filters.

11. The manufacturing method of the transistor on color filter type organic light emitting display according to claim 9, wherein a material of the anode is indium tin oxide.

* * * * *